(12) United States Patent
Zemen et al.

(10) Patent No.: US 11,411,171 B2
(45) Date of Patent: Aug. 9, 2022

(54) NON-VOLATILE MEMORY CELL

(71) Applicant: IP2IPO Innovations Limited, London (GB)

(72) Inventors: Jan Zemen, Celákovice (CZ); Bin Zou, London (GB); Andrei Mihai, London (GB)

(73) Assignee: IP2IPO Innovations Limited, London (GB)

( * ) Notice: Subject to any disclaimer, the term of this patent is extended or adjusted under 35 U.S.C. 154(b) by 0 days.

(21) Appl. No.: 17/265,853

(22) PCT Filed: Aug. 6, 2019

(86) PCT No.: PCT/GB2019/052203
§ 371 (c)(1),
(2) Date: Feb. 4, 2021

(87) PCT Pub. No.: WO2020/030901
PCT Pub. Date: Feb. 13, 2020

(65) Prior Publication Data
US 2021/0175415 A1    Jun. 10, 2021

(30) Foreign Application Priority Data
Aug. 7, 2018 (GB) ...................... 1812823

(51) Int. Cl.
*G11C 11/00* (2006.01)
*H01L 43/02* (2006.01)
(Continued)

(52) U.S. Cl.
CPC ............ *H01L 43/02* (2013.01); *G11C 11/161* (2013.01); *G11C 11/1673* (2013.01); *H01L 27/222* (2013.01); *H01L 43/10* (2013.01)

(58) Field of Classification Search
CPC ....... H01L 43/02; H01L 27/222; H01L 43/10; G11C 11/161; G11C 11/1673
(Continued)

(56) References Cited

U.S. PATENT DOCUMENTS 6,807,092 B1 * 10/2004 Braun .................... H01L 43/08
365/158
7,211,199 B2 * 5/2007 Chen ................... H01L 45/1608
257/295
(Continued)

FOREIGN PATENT DOCUMENTS

| CN | 105720188 A | 6/2016 |
|---|---|---|
| CN | 108447982 A | 8/2018 |

(Continued)

OTHER PUBLICATIONS

Lukashev et al., "Large Magnetoelectric Effect in Ferroelectric/Piezomagnetic Heterostructures", Physical Review B 84, 134420 (2011).
(Continued)

*Primary Examiner* — Viet Q Nguyen
(74) *Attorney, Agent, or Firm* — Smith Gambrell & Russell LLP (57) ABSTRACT

The disclosed non-volatile memory cell comprises a storage layer of an electrically insulating polarisable material in which data is recordable as a direction of electric polarisation, preferably of ferroelectric material, arranged between a magnetically frustrated layer, preferably of Mn-based antiperovskite piezomagnetic material and a conduction electrode. The magnetically frustrated layer has a different change in density of states relative to the conduction electrode in response to a change in electric polarisation of the
(Continued)

storage layer, such that an electron or spin tunnelling resistance across the storage layer is dependent on the direction of electric polarisation.

20 Claims, 3 Drawing Sheets

(51) Int. Cl.
 *G11C 11/16* (2006.01)
 *H01L 27/22* (2006.01)
 *H01L 43/10* (2006.01)
(58) Field of Classification Search
 USPC .................................................. 365/157, 158
 See application file for complete search history.

(56) References Cited

U.S. PATENT DOCUMENTS

| | | | |
|---|---|---|---|
| 8,652,347 B2 * | 2/2014 | Chen ..................... | H01L 45/147 427/457 |
| 9,305,628 B2 * | 4/2016 | Stainer ................. | G11C 11/1675 |
| 9,343,130 B2 | 5/2016 | Eigler et al. | |
| 9,376,328 B2 * | 6/2016 | Guardia Giros ... | C01G 49/0018 |
| 9,424,904 B2 | 8/2016 | Lee et al. | |
| 9,871,193 B2 | 1/2018 | Kioussis et al. | |
| 2013/0070522 A1 | 3/2013 | Saida et al. | |
| 2014/0021824 A1 | 1/2014 | Gayosso et al. | |
| 2014/0043895 A1 | 2/2014 | Bibes | |
| 2014/0169061 A1 | 6/2014 | Bibes et al. | |
| 2014/0319634 A1 | 10/2014 | Shukh | |
| 2015/0022832 A1 | 1/2015 | Choulet | |
| 2015/0228321 A1 | 8/2015 | Lee et al. | |
| 2015/0364536 A1 | 12/2015 | Bibes et al. | |
| 2016/0043307 A1 | 2/2016 | Kioussis et al. | |
| 2018/0151798 A1 | 5/2018 | Pandey | |

FOREIGN PATENT DOCUMENTS

| | | | | |
|---|---|---|---|---|
| EP | 2207177 A2 | * | 7/2010 | ........... G11B 11/002 |
| EP | 2447948 A1 | | 10/2011 | |
| EP | 2882004 A1 | | 6/2015 | |
| EP | 3001470 A1 | | 3/2016 | |
| EP | 3062215 A1 | * | 8/2016 | ............. G06F 7/588 |
| EP | 3185245 A1 | | 6/2017 | |
| JP | 2016063062 A | | 4/2016 | |
| WO | 2006103065 A1 | | 10/2006 | |
| WO | WO-2013150496 A1 | * | 10/2013 | ............. B82Y 30/00 |
| WO | 2010142762 A1 | | 12/2016 | |
| WO | 2017018391 A1 | | 2/2017 | |
| WO | 2018/109441 A1 | | 6/2018 | |

OTHER PUBLICATIONS

Duan et al., "Predicted Magnetoelectric Effect in Fe/BaTiO3 Multilayers: Ferroelectric Control of Magnetism"., Physical Review Letters, vol. 97: No. 047201 (2006).

Zelezny et al., "Spin-Polarized Current in Noncollinear Antiferromagnets", Physical Review Letters, vol. 119: No. 187204 (2017).

Quindeau et al., "Four-State Ferroelectric Spin-Value", Scientific Reports vol. 5: No. 09749 (May 11, 2015).

Zhang et al., "Giant Tunnel Magnetoresistance with a Single Magnetic Phase-Transition Electrode", Physical Review Applied, vol. 9: No. 4, 044034 (Apr. 24, 2018).

Yin et al., "Enhanced Tunnelling Electroresistance Effect Due to a Ferroelectrically Induced Phase Transition at a Magnetic Complex Oxide Interface", Nature Materials, vol. 12: No. 5 (Feb. 17, 2013).

Gajek et al., Tunnel Junctions with Multiferroric Barriers, Nature Materials, vol. 6: No. 4 (Mar. 11, 2007).

Quindeau et al., Original of Tunnel Electroresistance Effect of PbTi03-based Multiferrroric Tunnel Junctions, Physical Review, vol. 92: No. 3, 035130 (Jul. 16, 2015).

Yin et al., "Ferromagnetic, Ferroelectric, and Optical Modulated Multiple Resistance States in Multiferroic Tunnel Junctions", ACS Applied Materials and Interfaces, vol. 11: No. 1 (Dec. 18, 2018).

* cited by examiner

NON-VOLATILE MEMORY CELL

The present invention relates to a non-volatile memory (NVM) cell and to a method of reading data from a non-volatile memory cell.

The present invention aims to fill the gap between the high performance, volatile, power inefficient computer random access memory (RAM) and the low performance, low cost, non-volatile data storage devices such as hard disk drives (HDDs).

In terms of improving the performance of data storage, the main candidate is NAND-Flash, the dominant technology in solid state drives (SSDs), which is currently too expensive to replace HDDs and its low endurance, performance, and energy efficiency prevent its application as RAM. Improved HDD technology such as the Heat Assisted Magnetic Recording (HAMR) also suffers from low performance and reliability issues. Among non-volatile memory technologies under development the main contenders are spin-transfer torque RAM (STT-RAM, suffers from limited scalability, requires relatively high current densities to achieve switching between states), Ferroelectric RAM (FRAM, uses destructive readout and suffers from lower endurance), Phase-change memory (PCM energy efficiency is low and relies on expensive, toxic materials), Resistive RAM (RRAM, uses destructive readout/reset and the passive memory arrays suffer from the sneak path problem) and multicell devices based on these principles.

Emerging memory technologies have various drawbacks in terms of data density, power consumption and reliability (endurance).

WO 2018/109441 discloses a memory cell comprising a storage layer comprised of a ferromagnetic material 20 to 50 nm thick in which data is recordable as a direction of magnetisation; a piezomagnetic layer comprised of an antiperovskite piezomagnetic material selectively having a first type of effect on the storage layer and a second type of effect on the storage layer dependent upon the strain in the piezomagnetic layer; and a strain inducing layer for inducing a strain in the piezomagnetic layer thereby to switch from the first type of effect to the second type of effect. This makes use of a change in strain in the piezomagnetic layer resulting in a change in interaction with the storage layer. The stored data is read by measuring the capacitance of the structure and no current flows during reading.

US 2016/043307 discloses a multiferroic tunnel junction (MFTJ) formed by two ferromagnetic (FM) layers (such as iron) sandwiching a ferroelectric (FE) layer (such as (Ba, Sr)TiO$_3$). Tunnelling electroresistance (TER), which uses the change in tunnelling resistance of the ferroelectric layer due to asymmetric screening of the polarisation by bound change at the two FM/FE interfaces upon switching the FE polarisation of the FE layer, is used to read the data stored as an electric polarisation of the FE layer.

Lukashev et al., Phys Rev B 84, 134420 (2011), discloses first principle calculations of the magnetoelectric effect in ferroelectric/piezomagnetic junctions.

SUMMARY OF INVENTION

The present invention provides a non-volatile memory cell (NVM) comprising a storage layer comprised of an electrically insulating and electrically polarisable material in which data is recordable as a direction of electric polarisation; a magnetically frustrated layer on one side of the storage layer and a conduction electrode on the other side of the storage layer; wherein the storage layer has a thickness of 10 nm or less; wherein the magnetically frustrated layer has a different change in density of states to the conduction electrode in response to a change in electric polarisation in the storage layer, such that a tunnelling resistance of the storage layer between the conduction electrode and magnetically frustrated layer is dependent on the direction of electric polarisation of the storage layer.

The magnetically frustrated layer has a much larger change in density of states due to a change in electric polarisation of the storage layer than a non-magnetically frustrated layer, such as previously used ferromagnetic materials such as iron, due to the magnetic frustration of the layer. This results in a large difference in tunnelling resistance with a change in polarisation of the storage layer. The tunnelling resistance can only be measured because of the relatively low thickness of the storage layer. Therefore ease and reliability of reading of the data stored in the storage layer as a direction of electric polarisation by measuring the tunnelling resistance of the storage layer is improved. The NVM according to the present invention exhibits a larger difference in resistance between up/down polarisation states than other ferroelectric or multiferroic tunnel junctions, leading to the NVM having a better "dynamical range". The NVM according to the present invention exhibits a much smaller net magnetic moment of each bit than other MTJs (MRAM) and MFTJs based on ferromagnetic materials, allowing for closer packing of bits without mutual magnetic cross-links. Further to this, the large difference in tunnelling resistance allows for a small applied potential difference, and corresponding low tunnelling current, to be used when reading the data from the device.

The NVM according to the present invention does not need to pass any current to switch the FE polarisation of the storage layer, in order to write data to the storage layer. This is a significant advantage of the present invention compared to STT-MRAM. The electric field alone is enough to write data to the storage layer. The negligible writing current reduces the power usage and heat generation when writing data, which is a desirable property for non-volatile memory cells. This advantage over STT-MRAM is shared by an alternative storage method—FRAM. However unlike FRAM, reading data from the NVM according to the present invention is not destructive and the smaller volume of the FE material used in the storage layer reduces the energy required for writing. Earlier versions of MRAM used an external magnetic field to write the data, the use of an electric field both to write and read the data in the storage layer is a further advantage of the NVM according to the present invention.

In an embodiment the storage layer is a ferroelectric material. Ferroelectric materials exhibit stable polarisation states, which improves the stability and non-volatility of the data stored in the storage layer.

In an embodiment the storage layer has a thickness of 0.1 nm or more, more preferably 0.4 nm or more and most preferably 1 nm or more. This allows easier manufacturability and good stability of the electric polarisation.

A preferable thickness of the storage layer is 5 nm or less and more preferably 3 nm or less. These limits lowers the applied voltage required to drive a tunnelling current through the storage layer, reducing the energy requirements of reading the data from the non-volatile memory cell.

In an embodiment, the storage layer is composed of a material selected from a group consisting of A'$_x$A"$_{(1-x)}$B'$_y$B"$_{(1-y)}$O$_3$ where A'&A" are one or more selected from a group comprising Ca, Sr, Ba, Bi, Pb, La and B'&B" are one or more selected from a group comprising Ti, Zr, Mo, W, Nb, Sn, Sb, In, Ga, Cr, Mn, Al, Co, Fe, Mg, Ni, Zn, Bi, Hf, Ta. Preferably, the storage layer is composed from $BaTiO_3$, $SrTiO_3$, $(Ba, Sr)TiO_3$, $Ba(Zr, Ti)O_3$, $PbTiO_3$ or $Pb(Zr, Ti)O_3$. These materials are ferroelectric oxides which can be stably electrically polarised above 220K. The storage layer may be ZnO doped with Li and/or Be. ZnO has a registration with a perovskite structure at the interface, can be stably electrically polarised, can be grown at lower temperature than perovskite oxides above, and so is suitable as a material for the storage layer.

In an embodiment the storage layer has a perovskite structure, or a structure that can be grown in crystalline form on a layer with perovskite structure. Many perovskite structures exhibit the stable polarisation states, electrical insulation and physical stability required for the storage layer of the present invention.

In an embodiment the storage layer is composed from a material with a perovskite-related structures such as $Bi_4Ti_3O_{12}$. Such materials allow the storage layer to be robust in high temperature environments.

In an embodiment the conduction electrode is a paramagnetic, ferrimagnetic, ferromagnetic, or antiferromagnetic material. These materials types exhibit magnetic ordering, and react differently to a magnetically frustrated material in response to change in polarisation state of the storage layer, as required by the present invention.

In an embodiment the conduction electrode has an antiperovskite structure. The anti-perovskite lattice is exactly the same as the perovskite one. The only difference is that oxygen is replaced by some metal (e.g., Mn) at the face-centre sites. Many antiperovskite structures exhibit the magnetic properties preferable for the present invention, while exhibiting good physical stability and electrical conductivity as required by the non-volatile memory cell. In combination with a perovskite structured storage layer this is particularly advantageous as the interface between such similar structures results in a stronger and more physically durable memory cell.

In an embodiment the conduction electrode is composed from a material selected from a group consisting of $Mn_3FeN$, $Mn_3ZnC$, $Mn_3AlC$, $Mn_3GaC$, $Mn_4N$, $Mn_{4-x}Ni_xN$, $Mn_{4-x}Sn_xN$, Pt, Au and Al. These materials are known to exhibit favourable ferromagnetic, ferrimagnetic or paramagnetic properties as required for the conduction electrode of the present invention.

In an embodiment the magnetically frustrated layer has an antiperovskite structure. Antiperovskite materials can exhibit the magnetic frustration properties required by the magnetically frustrated layer, while exhibiting good physical properties and electrical conductivity. Further to this the use of an antiperovskite structure is likely to lead to a stronger and more physically durable memory cell and/or a low lattice mismatch if used in conjunction with a perovskite storage layer material.

In an embodiment the magnetically frustrated layer is a piezomagnetic material. Piezomagnetic materials are an example of materials that exhibit the magnetic frustration required by the magnetically frustrated layer of the present invention.

In an embodiment magnetically frustrated layer is $Mn_3GaN$ or $Mn_3NiN$, or $Mn_3GaN$ or $Mn_3NiN$ based such as $Mn_{3-x}A_xGa_{1-y}B_yN_{1-z}$ or $Mn_{3-x}A_xNi_{1-y}B_yN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn. Such materials exhibit strong magnetic frustration. $Mn_3GaN$ is preferable, as it exhibits the largest observed magnetocapacitance.

In a further embodiment the magnetically frustrated layer is $Mn_3SnN$ or $Mn_3SnN$ based such as $Mn_{3-x}A_xSn_{1-y}B_yN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn. Preferably, the magnetically frustrated layer is $Mn_3SnN$ with roughly 10% N deficiency. The response of the magnetic moments to a symmetry lowering induced by the storage layer polarisation in the adjacent layer is the largest. It also has the highest Neel temperature of around 475K. In an embodiment the magnetically frustrated layer is $Mn_3SnN_{0.9}$. These materials advantageously exhibit high Neel temperatures (the temperature above which the material becomes paramagnetic rather than antiferromagnetic and so the desired properties are lost). These groups of materials are known to exhibit strong magnetic frustration, as required by the magnetically frustrated layer of the present invention.

In an embodiment the lattice mismatch between the storage layer and the magnetically frustrated layer and/or between the storage layer and the conduction electrode is less than ±10%, preferably less than ±1%. The chemical composition of the magnetically frustrated layer and the storage layer can be tuned to achieve such low lattice mismatch. A low lattice mismatch between the various layers has the advantage of minimising the lattice strain experienced by the interface regions of the various layers. Reducing the interface strain can help increase the mechanical lifetime of the non-volatile memory cell components.

In an embodiment there is provided a method of reading data from a non-volatile memory cell comprising a storage layer in which data is stored as a direction of electric polarisation, the storage layer being sandwiched between a conduction electrode and a magnetically frustrated layer, wherein the conduction electrode and magnetically frustrated layer have a different change in density of states in response to a change in electric polarisation in the storage layer, the method comprising: measuring the tunnelling resistance between the conduction electrode and the magnetically frustrated material, thereby to determine an electric polarisation direction of the storage layer and so read the data stored in the storage layer. The magnetically frustrated layer causes a large difference in tunnelling resistance through the storage layer when the direction of electrical polarisation of the storage layer is changed. This is advantageous because it improves the accuracy of reading the data from the storage layer.

In an embodiment, the data is read from the storage layer by applying a potential difference between the conduction electrode and the magnetically frustrated layer and measuring the tunnelling current. When the electronic states in the conduction electrode and magnetically frustrated layer are favourably aligned (in momentum space), a small potential difference applied between the two layers can drive a tunnelling current through the storage layer. When the electronic states in the conduction electrode and magnetically frustrated layer are not favourably aligned (in momentum space), the large increase in tunnelling resistance discussed above means that a small potential difference applied between the two layers can drive only a much smaller tunnelling current through the storage layer. Thus, the large difference in tunnelling resistance means that a small potential difference can be used to accurately measure the polarisation direction of the storage layer. This is advantageous because even when the electronic states in the conduction electrode and magnetically frustrated layer are favourably aligned (in momentum space), the small tunnelling current that is driven through the storage layer during reading uses very little power and thus generates very little heat.

In an embodiment, the potential difference applied between the conduction electrode and the magnetically frustrated layer in order to read the data from the storage layer is lower than that required to change the electric polarisation of the storage layer. This is advantageous because the risk of inadvertently changing the polarisation direction of the storage layer, and thus rewriting the data stored therein, is lowered. The use of a tunnelling resistance allows for non-destructive reading which is advantageous compared to FRAM where the reading has to be followed by rewriting which leads to more fatigue of the memory cell.

In an embodiment, the storage layer 10 has a magnetic order due to the proximity of the conduction electrode 20 and magnetically frustrated layer 30. The transmission probability through the storage layer 10 then depends on the spin polarisation state of the tunnelling electrons. This has the advantage that it increases the change in tunnelling resistance through the storage layer 10 when the electric polarisation direction of the storage layer 10 is changed.

Embodiments of the invention will now be described by way of example only with reference to and as illustrated in the following drawings.

Figure 1:
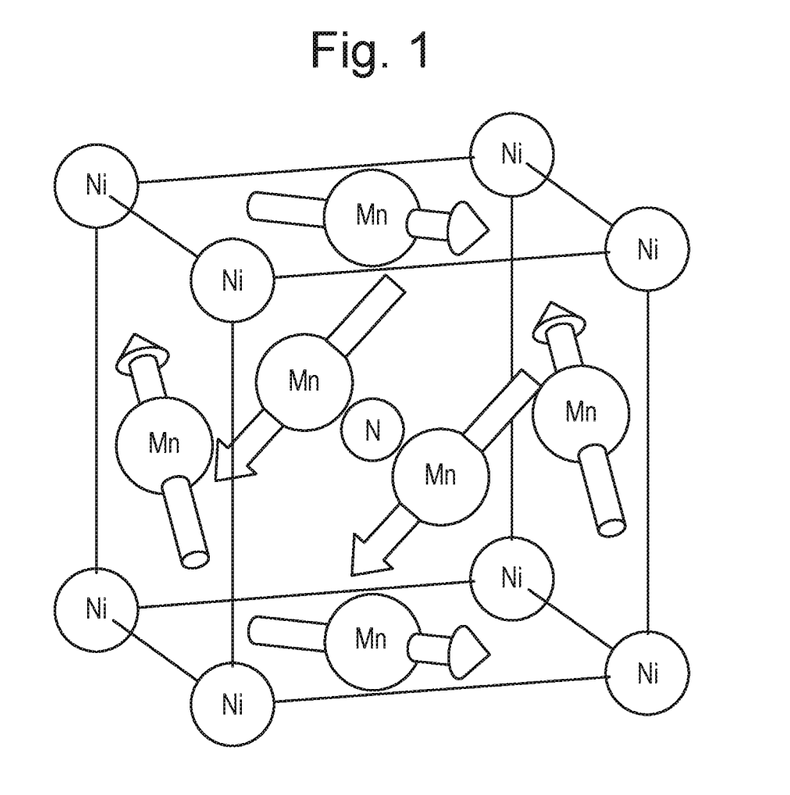
FIG. 1 is a schematic illustration of the lattice and magnetic structure of an antiperovskite piezomagnetic material ($Mn_3NiN$)

The present invention makes use of the properties of magnetically frustrated materials with a non-collinear antiferromagnetic ground state. An example class of a material which exhibit magnetic frustration are piezomagnetic materials. In such materials there is an antiferromagnetic interaction between the magnetic moments of nearest neighbour atoms (Mn in the figure illustrated example). Due to the lattice structure of the material it is not possible to arrange the moments of these atoms such that all interactions between the spins are anti-parallel. An arrangement results whereby the net overall spin is zero. However the magnetic order is unstable with respect to any symmetry breaking of the cubic lattice. Pertinent to the present invention, the magnetic moments change size upon application of applied electric fields.

FIG. 1 illustrates the structure of a manganese based antiperovskite material ($Mn_3NiN$). As illustrated, it is not possible to arrange the atomic spin orientations (illustrated by arrows) of the Mn atoms so that all interaction between the spins of the Mn atoms are anti-parallel. The system is therefore described as magnetically frustrated. The material occupies a state whereby the net spin is zero.

Figure 2:
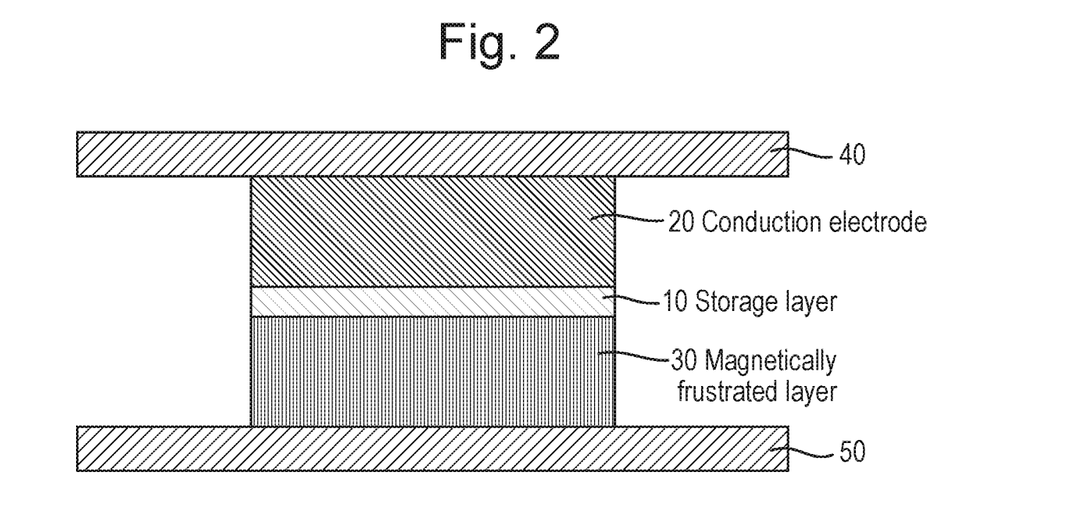
FIG. 2 is a cross-sectional schematic diagram of a non-volatile magnetic memory cell according to a first embodiment.

The present invention makes use of the magnetic frustrations property and the effect on the density of states when the magnetically frustrated layer interacts with an electrically polarised layer with which it is in contact. FIG. 2 shows a cross-sectional schematic diagram of a non-volatile magnetic (NVM) memory cell according to a first embodiment. The NVM cell comprises a storage layer 10 in which data is recordable as a direction of electric polarisation.

Generally the directions of electric polarisation in the storage layer 10 are perpendicular to the plane in which the storage layer 10 lies, but this is not necessarily the case. The electric polarisation can be induced by applying an electric field across the storage layer 10. The electric polarisation remains when the applied electric field is removed (the storage layer 10 is stably electrically polarisable). The storage layer 10 is therefore able to store at least one bit of data, with a "1" or a "0" each corresponding to one of two stable polarisation directions i.e. it is a two-state non-volatile memory.

The storage layer 10 may be composed of a ferroelectric material. A ferroelectric material exhibits stable electric polarisation, so that data can be stored in the storage layer 10 as a direction of polarisation (for example either an up or down electric polarisation) and the data will be preserved even when the electric field inducing the polarisation is removed.

The storage layer 10 is thin enough to exhibit quantum tunnelling when a low voltage is applied (e.g. approximately 1 mV or less in the case of a 1-10 nm thick storage layer). The storage layer 10 preferably has a thickness of 0.1 nm or more, more preferably 0.4 nm or more and most preferably 1 nm or more. Increasing the thickness eases manufacturability, and is also preferable such that a sufficiently large electron tunnelling barrier exists to prevent a tunnelling current from passing through the storage layer 10 when the density of states in momentum space of the conduction electrode and the magnetically frustrated layer are not favourably aligned. This is advantageous as a larger difference in the tunnelling resistance will be present at different polarisations thereby easing accurate reading of the data from the storage layer 10. A storage layer 10 thicker than 0.1 nm is also preferable because the stability of the polarisation of the storage layer 10 increases with layer thickness. Moreover if the storage layer 10 is too thin, the capacity of the trilayer could be so high that the charging of the device during writing inhibits the operation of the NVM.

The storage layer 10 has a thickness of 10.0 nm or less, more preferably 5.0 nm or less and most preferably 3.0 nm or less. The lower the thickness of the storage layer 10 the lower the potential difference required to drive a tunnelling current through the storage layer 10 when the density of states in momentum space of the conduction electrode 20 and the magnetically frustrated layer 30 are favourably aligned. Too high a storage layer 10 thickness results in too low a tunnelling current which can be hard to detect. A low potential difference reduces the risk of the electric polarisation of the storage layer 10 being inadvertently altered when reading the data, and also reduces the power consumption and heat production when reading the data. The maximum and minimum limitations of thickness offer an acceptable trade-off between stability of the data stored (favoured by a thicker storage layer 10), and minimising the required applied voltage to drive a tunnelling current through the barrier during reading (favoured by a thinner storage layer 10). The preferred range is 0.4 nm to 10.0 nm, more preferably 0.4 to 5.0 nm thick.

Ferroelectric oxides are preferred as the storage layer 10, particularly those with stable FE polarisation above 220 K, preferably up to 500 K. For example, the storage layer 10 may be comprised from a material selected from a group consisting of $A'_xA''_{(1-x)}B'_yB''_{(1-y)}O_3$ where A'&A" are one or more selected from a group comprising Ca, Sr, Ba, Bi, Pb, La and B'&B" are one or more selected from a group comprising Ti, Zr, Mo, W, Nb, Sn, Sb, In, Ga, Cr, Mn, Al, Co, Fe, Mg, Ni, Zn, Bi, Hf, Ta. Particular examples are $BaTiO_3$, $(Ba, Sr)TiO_3$ and $PbTiO_3$. Perovskite-related structures such as $Bi_4Ti_3O_{12}$ could also be used. Such materials allow the storage layer 10 to be robust in high temperature environments.

ZnO could also be used as the storage layer 10, even though it is not a perovskite material because it may nevertheless hold a stable electric polarisation when doped with Li or Be, i.e., it is ferroelectric.

The storage layer 10 may have a perovskite structure. This is particularly advantageous if the layers in contact with the storage layer 10 have a perovskite or antiperovskite structure. This is from an electronic structure point of view between the adjacent layers as well as from a mechanical durability point of view. Choosing the layers to all be perovskite or antiperovskite is one way to help achieve a desirable lattice mismatch between the layers of less than ±10% and preferably less than ±1% which helps with quantum mechanical interaction between the layers as well as mechanical stability. ZnO achieves good crystallinity at low annealing temperature and so is a preferred material for the storage layer 10.

Figure 4:
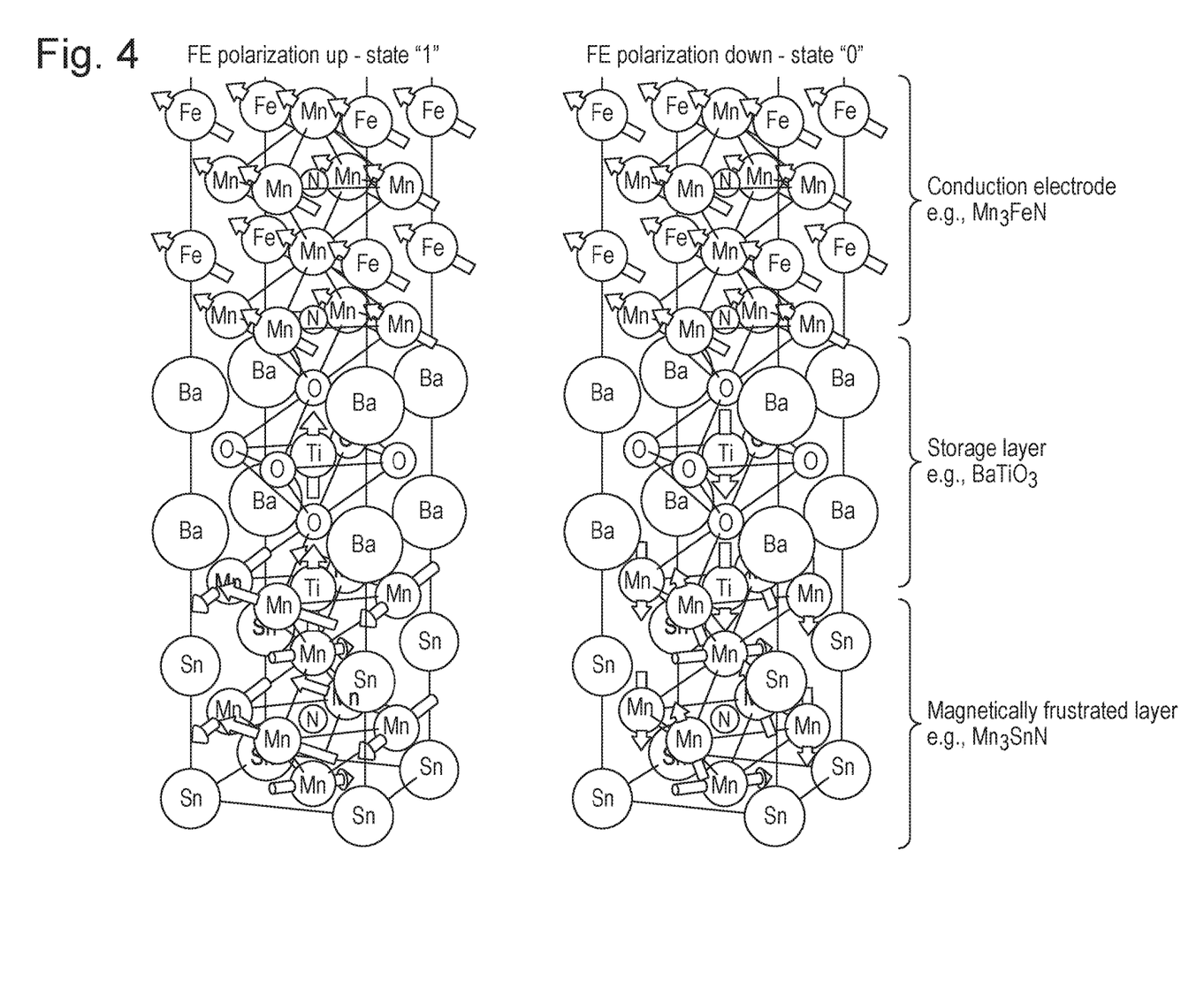
FIG. 4 is a schematic illustration of a conduction electrode, a storage layer and a magnetically frustrated layer according to an embodiment of the invention, demonstrating an example of two stable polarisation states for the storage layer.

A magnetically frustrated layer 30 which is made of a material exhibiting the above explained magnetic frustration is provided on one side of the storage layer 10. The storage layer 10 and magnetically frustrated layer 30 are in contact with one another. Electric polarisation of the storage layer 10 (e.g. up or down) results in a different spin orientation in the adjacent magnetically frustrated layer 30 as illustrated in FIG. 4.

Figure 3:
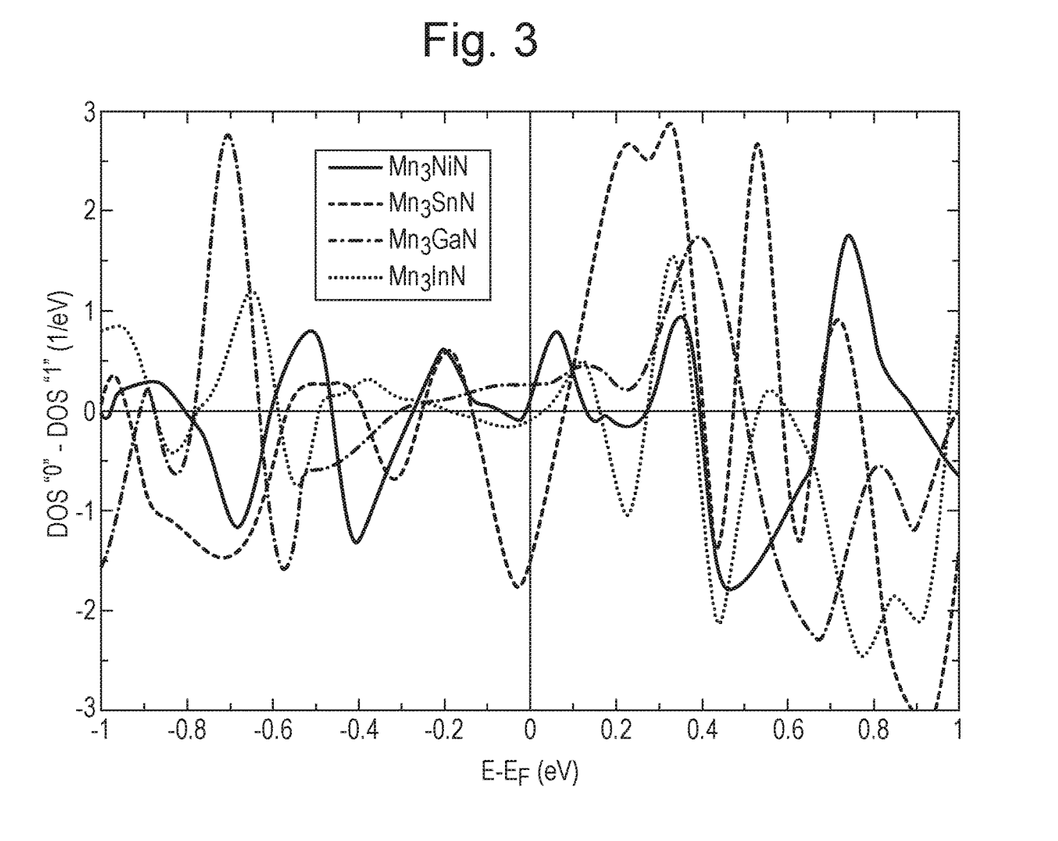
FIG. 3 shows the effect of the polarisation of the storage layer on the density of states of the magnetically frustrated layer. The y-axis shows the difference in the density of states (DOS) in the magnetically frustrated material between an electric polarisation state of "1" ($DOS^{"1"}$) and "0" ($DOS^{"0"}$) for the storage layer. The x-axis shows the energy (E) relative to the Fermi energy ($E_F$).

FIG. 3 illustrates a simulation of the how the density of states in the magnetically frustrated layer 30 changes in response to a change in the polarisation direction of the storage layer 10. The electric polarisation of the storage layer 10 results in an electric field being applied to the adjacent magnetically frustrated layer 30. This electric field results in a significant change in the orientation of the magnetic spins in the region of the magnetically frustrated layer 30 adjacent to the storage layer 10. The density of states of the magnetically frustrated layer 30 is strongly dependent on the orientation and size of the magnetic moments of the magnetically frustrated layer 30 structure. Thus, the polarisation direction of the storage layer 10 significantly changes the density of states in the adjacent magnetically frustrated layer 30, as demonstrated by FIG. 3. The difference in tunnelling resistance is proportional to the difference in density of states. One can see that $Mn_3SnM$ is particularly favourable for the NVM device.

The present invention makes use of the phenomenon shown in FIG. 3 for reading the data stored as an electric polarisation direction in the storage layer 10.

As shown in FIG. 2, a conduction electrode 20 is also provided to the other side of the storage layer 10 to the magnetically frustrated layer 30. The conduction electrode 20 and storage layer 10 are in contact with each other.

The magnetic ordering of the magnetically frustrated layer 30 changes differently to the magnetic ordering of the conduction electrode 20, in response to a change in electric polarisation direction in the storage layer 10. The material of the conduction electrode 20 is not important as long as it exhibits this properly and is electrically conductive.

The material of the conduction electrode 20 may have magnetic ordering, and therefore may be a paramagnetic, ferrimagnetic, ferromagnetic or antiferromagnetic material. The conduction electrode 20 may have a perovskite or antiperovskite structure, the advantage being the same as described above in relating to the magnetically frustrated layer 30 and storage layer 10.

The conduction electrode 20 may be composed from a material selected from a group consisting of $Mn_3FeN$, $Mn_3ZnC$, $Mn_3AlC$, $Mn_3GaC$, $Mn_4N$, $Mn_{4-x}Ni_xN$, $Mn_{4-x}Sn_xN$. All of these have antiperovskite structures with Mn in the same positions as in the magnetically frustrated layer 30 so good alignment of the electronic states for one storage layer polarisation direction can be assumed. Other example materials are Pt, Au and Al.

The conduction electrode 20 could be from a perovskite oxide such as LSMO (lanthanum strontium manganite).

The magnetically frustrated layer 30 may have an antiperovskite structure. The magnetically frustrated layer 30 may be a piezomagnetic material. The magnetically frustrated layer may be $Mn_3GaN$ or $Mn_3NiN$, or $Mn_3GaN$ or $Mn_3NiN$ based such as $Mn_{3-x}A_xGa_{1-y}B_yN_{1-z}$ or $Mn_{3-x}A_xNi_{1-y}B_yN_{1-z}$, where A and B are one or more elements selected from the list including: Ag, Al, Au, Co, Cu, Fe, Ga, Ge, In, Jr, Ni, Pd, Pt, Rh, Sb, Si, Sn, Zn. The magnetically frustrated layer may be $Mn_3SnN$ or $Mn_3SnN$ based such as $Mn_{3-x}A_xSn_{1-y}B_yN_{1-z}$, where A and B are one or more elements selected from the list including: Ag, Al, Au, Co, Cu, Fe, Ga, Ge, In, Jr, Ni, Pd, Pt, Rh, Sb, Si, Sn, Zn. Preferably the magnetically frustrated layer 30 is $Mn_3SnN_{1-x}$, where $0.01 \leq x \leq 0.2$, more preferably $Mn_3SnN_{0.9}$, which is $Mn_3SnN$ with 10% N deficiency. The response of the magnetic moments to a symmetry lowering induced by the storage layer polarisation in the adjacent layer is the largest. It also has the highest Neel temperature of around 475K. Alternatively, the magnetically frustrated layer 30 is preferably $Mn_3GaN$ (which exhibits high magnetocapacitance) or $Mn_3NiN$ (extensively studied and low cost). FIG. 4 shows an example of a possible arrangement of a conduction electrode 20, a storage layer 10 and a magnetically frustrated layer 30. In this case the conduction electrode 20 is $Mn_3FeN$, the storage layer 10 is $BaTiO_3$, and the magnetically frustrated layer is $Mn_3NiN$. All three of these materials have a perovskite or antiperovskite type structure, which minimises the lattice mismatch between the layers. This is advantageous because lattice mismatch can lead to strain in the interface region between the layers, which in turn can lead to mechanical fatigue and cracking during use. Therefore it is preferable that the lattice mismatch between the storage layer 10 and the magnetically frustrated layer 30 and/or between the storage layer 10 and the conduction electrode 20 is less than ±10%, preferably less than ±1%.

FIG. 4 shows the two electric polarisation directions of the storage layer 10 (on the left and right) which correspond to the two data values that can be stored in the storage layer 10 (and an unpolarised state in the middle).

The operation of an embodiment of the present invention will now be described in detail with reference to the accompanying drawings.

In the non-volatile memory cell of the present invention, data is recordable in the storage layer 10 as a direction of electric polarisation (up or down as illustrated). This data is written to the storage layer 10 by applying an electric field to the storage layer 10 across the non-volatile memory cell. This field can be applied, for example, by a first electrode 40 placed (in contact with) on the other side of the conduction electrode 20 from the storage layer 10, and a second electrode 50 (in contact with) placed on the other side of the magnetically frustrated layer 30 to the storage layer 10. Data is then written to the storage layer 10 by applying a potential difference between the first electrode 40 and second electrode 50 of sufficient magnitude that the stable electric polarisation of the storage layer 10 is in the desired direction. In order to rewrite the data stored in the storage layer 10, a potential difference is applied in the opposite direction of sufficient magnitude that the electric polarisation of the storage layer 10 is reversed.

The polarisation of the storage layer 10 causes a potential difference to exist across the storage layer 10. This potential difference causes an electric field which extends a few atomic layers into the conduction electrode 20 and the magnetically frustrated layer 30. The material of the conduction electrode 20 and of the magnetically frustrated layer 30 behave differently when exposed to the electric field resulting from the polarisation of the storage layer 10. The electric field influences the magnetic polarisation of both the conduction electrode 20 and the magnetically frustrated layer 30. However, the magnetically frustrated layer 30 will experience a much greater change in magnetic polarisation as a result of the electric field resulting from the electric polarisation of the storage layer 10.

In an embodiment the conduction electrode 20 has a density of states that is relatively unaffected by the polarisation of the storage layer 10. The polarisation of the storage layer 10 strongly influences the density of states in the magnetically frustrated layer 30, as illustrated in FIG. 3 and as described above.

In order to read the data stored in the storage layer 10, a potential difference is applied across the storage layer 10 in a similar fashion to how the data is written. The magnitude of the read potential difference is lower than that required to change the electric polarisation state of the storage layer 10, which prevents the data from being overwritten.

The applied read potential difference drives a tunnelling current between the conduction electrode 20 and magnetically frustrated layer 30, through the storage layer 10. The tunnelling resistance is strongly dependent on the magnetic polarisation of the magnetically frustrated layer 30, which in turn is strongly affected by the electric polarisation of the storage layer 10. If the electronic states in the conduction electrode 20 and magnetically frustrated layer 30 are well aligned in the momentum space, the tunnelling resistance of the storage layer 10 is low and thus a current above a predetermined magnitude will flow through the storage layer 10. However, if the density of states in the conduction electrode 20 and magnetically frustrated layer 30 are not well aligned in momentum space, the tunnelling resistance of the storage layer 10 is significantly higher and the current will therefore be lower, for example below the predetermined magnitude. Thus, by measuring the tunnelling current passing through the storage layer 10, the electric polarisation direction of the storage layer 10 can be determined by determining whether the measured current is above or below the predetermined magnitude.

In an embodiment, the potential difference applied between the conduction electrode 20 and the magnetically frustrated layer 30 in order to read the data from the storage layer 10 is lower than that required to change the electric polarisation of the storage layer 10. This is advantageous because the risk of inadvertently changing the polarisation direction of the storage layer 10, and thus rewriting the data stored therein, is lowered. Further to this, the use of a smaller potential difference results in a smaller tunnelling current passing through the storage layer 10 during reading, which lowers the power usage and heat generated during reading. The use of a tunnelling resistance allows for non-destructive reading which is advantageous compared to FRAM where the reading has to be followed by rewriting which leads to more fatigue of the memory cell.

In an embodiment, the storage layer 10 has a magnetic order due to the proximity of the conduction electrode 20 and magnetically frustrated layer 30. The transmission probability through the storage layer 10 then depends on the spin polarisation state of the tunnelling electrons. This has the advantage that it increases the change in tunnelling resistance through the storage layer 10 when the electric polarisation direction of the storage layer 10 is changed. When the individual NVM cells are combined into an array, the error rate of the array is smaller when the change in tunnelling resistance of each of the NVM cells is larger. Further to this, the larger change in tunnelling resistance with changing electronic polarisation direction of the storage layer 10 may allow for a smaller potential difference to be used when reading the data. As discussed previously, using a smaller potential difference for reading the data stored in the storage layer 10 is advantageous in several ways.

The invention uses a frustrated antiferromagnet as an electrode sensitive to the FE polarisation in a tunnel junction. Ferromagnets have been used in this situation before. Thus the reading mechanism is more reliable due to the stronger dependence of the tunnelling resistance on the direction of polarisation of the storage layer 10, namely the tunnelling piezomagnetic magnetoresistance (TMPR) effect because of the use of a magnetically frustrated material in place of a non-magnetically frustrated ferromagnet. An advantage compared to MRAM is the much lower net magnetic moment of the active layer due to its antiferromagnetic ordering.

TMPR has two contributions: (a) the alignment (in momentum space) of available electronic states at the interfaces between the conduction electrode 20 and the magnetically frustrated layer 30 and (b) the transmission probability through the storage layer 10 as a function of the electronic momentum and spin state.

The conduction electrode 20 has a density of states in momentum space that is relatively unaffected by the polarisation of the storage layer 10. The polarisation of the storage layer 10 strongly influences the density of states of the magnetically frustrated layer 30. A low tunnelling resistance occurs when there is a corresponding high density of states in both the conduction electrode 20 and magnetically frustrated layer 30 for a given electron angular momentum, hence why the tunnelling resistance is strongly dependent on the storage layer 10 polarisation. This is contribution (a).

Contribution (b) is dependent on the thickness and composition of the storage layer 10 and also on the alignment of available states from contribution (a). Once the electronic states in both the conduction electrode 20 and the magnetically frustrated layer 30 are available and well aligned in the momentum space then the "filtering" properties of the storage layer 10 start playing a role. In case of magnetic ordering in the storage layer 10 induced by the adjacent magnetic electrodes (the conduction electrode 20 and magnetically frustrated layer 30) there can be an additional spin-filtering effect (electrons can or cannot pass the storage layer 10 depending on their spin-polarisation). Even ferroelectric materials such as $BaTiO_3$ or $SrTiO_3$ can develop magnetic order in thin films adjacent to ferromagnetic or antiferromagnetic layers. This can be enhanced if the perovskite structure is shared by the storage layer 10 and the magnetically frustrated layer 30. Finally, the resistance depends on the thickness of the storage layer 10 but the thickness does not change between the 1/0 states so is not used for reading. Applying a small electric field (contribution (b)) results in electrons tunnelling through the storage layer 10 if the density of states are favourably aligned (contribution (a)), which allows the polarisation direction of the storage layer 10 to be determined, and thus the data to be read from the device. The reading is achieved by applying a small voltage (or electric field) and measuring the current through the junction (both contributions are relevant when the small field is applied to read the cell). Contribution (a) is based on "ground state property" of the materials (the density of electronic states) whereas contribution (b) takes into account also the "excited state property", i.e., the response of the system to applied voltage.

Both contributions depend on the directions of electric polarisation of the storage layer 10 so its direction can be detected as a distinct value of resistance (e.g. above or below a predetermined level). The related reading current is much smaller than the large current required to write information in standard magnetic NVM, e.g., spin-transfer-torque RAM, so the Joule heating and energy requirements are very low. The storage layer 10 may develop a magnetic order due to its proximity to magnetically ordered electrodes (the conduction electrode 20 and the magnetically frustrated layer 30). This will enhance contribution (b) but decreases in thicker storage layers 10. Thus a storage layer 10 thickness between 0.1 nm and 10 nm is preferable. A storage layer 10 thickness between 0.4 nm and 10 nm is more preferable because a minimum thickness of 0.4 nm or greater increases the stability of the polarisation direction of the storage layer 10, and thus the stability of the data stored therein. TPMR can work even using contribution (a) only. The piezomagnetic response of the Mn-based antiperovskite nitrides is driven by lowering of the cubic symmetry but in the present invention the strain is replaced by the local electric field provided by the storage layer 10. Only several atomic layers close to the storage layer 10 are affected by this field but that is enough to modify the tunnelling resistance.

The conduction electrode 20 and the magnetically frustrated layer 30 do not behave symmetrically—they are made of different materials or the atomic composition of the interfaces is different—otherwise the tunnelling resistance would be the same for both electric polarisation directions.

Due to the resistive reading, the memory cell of the present invention can be integrated into standard 2D array (used in DRAM or STT-RAM) where each cell uses a single access transistor. Compared to magnetic NVM, the stray fields are negligible or identical at each cell allowing for high packing density. Due to storing information in the storage layer 10, many remaining properties (write times, retention times, and energy per write operation) are comparable to those of Ferroelectric memory cells.

The invention provides an easily implementable new non-volatile solution for memory and data storage application that surpasses existing technology in terms of power consumption, temperature stability, endurance and speed. It also functions at high temperatures (above 180° C.), and consumes very little power, a combination ready for future applications such as the IOT space devices.

The multilayers of this device can be manufactured using any thin film deposition method, optimised for the required layers. For example, a pulsed laser deposition (PLD) can be used. Example growth conditions for each thin film follow below. The NVM described herein can be manufactured using the methods, conditions and materials as outlined in WO 2018/109441, the entirety of the contents of which are hereby incorporated by reference. Non-limiting examples are given below.

Step 1: Substrate Selection and Cleaning.

Any suitable oxide substrate (e.g. MgO, $SrTiO_3$, Nb:$SrTiO_3$, $(LaAlO_3)_{0.3}(Sr_2TaAlO_6)_{0.7}$) or Si can be used as the substrate. The substrate is cleaned with a standard solvent clean procedure prior to the growth. The standard solvent clean procedure which may be a three-minute clean in an ultrasonic bath with Acetone, then Isopropanol and finally Distilled Water, with a $N_2$ blow dry after each solvent step. In an embodiment, the substrate may become the second electrode 50.

Step 2: Multilayer Growth (PLD and Magnetron Sputtering).

Thin films are deposited by PLD using a KrF excimer laser (=248 nm). Stoichiometric single phase targets of $SrRuO_3$, Nb:$SrTiO_3$, $BaTiO_3$, $Ba_xSr_{1-x}TiO_3$, $BaZr_xTi_{1-x}O_3$, $Mn_3SnN$ and $Mn_3GaN$ respectively, are ablated by a laser with fluency of 0.8 $J/cm^2$ at 10 Hz.

Layer 1—Second Electrode 50-100 nm $SrRuO_3$ thin film is grown at 700° C.-780° C. under an $O_2$ partial pressure of 50-300 mTorr. After deposition, the grown film is subsequently in-situ post-annealed for 20 minutes at the growth temperature under an $O_2$ partial pressure of 600 Torr. Then, the sample is cooled down to room temperature at 10° C./min under an $O_2$ partial pressure of 600 Torr.

Or 100 nm Nb:$SrTiO_3$ thin film, grown at 700° C. under an $O_2$ partial pressure of 0-60 mTorr. After growth, the sample is cooled down to room temperature at 10° C./min under an $O_2$ partial pressure of 600 Torr.

Layer 2—magnetically frustrated layer 30 of $Mn_3XN$, where X is any suitable element—for example, 100 nm $Mn_3SnN$ thin film is grown at 300° C.-550° C. under a $N_2$ partial pressure of 0-12 mTorr. After growth, the sample is cooled down to room temperature at 10° C./min under a $N_2$ partial pressure of 0-12 mTorr.

Or 100 nm $Mn_3GaN$ grown at 300° C.-550° C. under a $N_2$ partial pressure of 0-12 mTorr. After growth, the sample is cooled down to room temperature at 10° C./min under the $N_2$ partial pressure of 0-12 mTorr.

Layer 3—electrically polarisable material of storage layer 10—0.1-10 nm $BaTiO_3$ ($Ba_xSr_{1-x}TiO_3$ or $BaZr_xTi_{1-x}O_3$) thin film is grown at 750° C.-800° C. under an $O_2$ partial pressure of 150-300 mTorr. After growth, the sample is cooled down to room temperature at 10° C./min under an $O_2$ partial pressure of 600 Torr.

Layer 4—conduction electrode 20-100 nm of a metal (for example Pt, Au) or a conductive perovskite thin film (for example $SrRuO_3$, Nb:$SrTiO_3$).

100 nm Pt thin film is grown by DC magnetron sputtering. The sample is heated to 800° C. in ultra-high vacuum and annealed for 1 hour. Pt thin film is deposited at 100 W DC power. After growth, the sample is cooled down to room temperature at 10° C./min under vacuum.

Or 100 nm $SrRuO_3$ thin film is grown at 700° C.-780° C. under an $O_2$ partial pressure of 50-300 mTorr. After deposition, the grown film is subsequently in-situ post-annealed for 20 minutes at the growth temperature under an $O_2$ partial pressure of 600 Torr. Then, the sample is cooled down to room temperature at 10° C./min under the $O_2$ partial pressure of 600 Torr.

Or 100 nm Nb:$SrTiO_3$ thin film, grown at 700° C. under an $O_2$ partial pressure of 0-60 mTorr. After growth, the sample is cooled down to room temperature at 10° C./min under an $O_2$ partial pressure of 600 Torr.

Layer 5—First Electrode 40-100 nm of a metal thin film (for example Pt, Au, Al). 100 nm Pt thin film is grown by DC magnetron sputtering. The sample is heated to 800° C. in ultra-high vacuum and annealed for 1 hour. Pt thin film is deposited at 100 W DC power. After growth, the sample is cooled down to room temperature at 10° C./min under vacuum.

Step 3: Photolithography.

A standard photolithography process has been implemented to apply an array pattern. For 2D devices, all layers can be deposited and then patterned.

Step 4: Etching.

A standard Argon Ion Milling process to remove material and transfer the pattern from photolithography onto the sample, or any other suitable chemical or physical etching technique is implemented.

The invention claimed is:

1. A non-volatile memory cell comprising:
   a storage layer comprised of an electrically insulating and electrically polarisable material in which data is recordable as a direction of electric polarisation;
   a magnetically frustrated layer on one side of the storage layer and a conduction electrode on the other side of the storage layer;
   wherein the storage layer has a thickness of 10 nm or less; and
   wherein the magnetically frustrated layer has a different change in density of states to the conduction electrode in response to a change in electric polarisation in the storage layer, such that a tunnelling resistance of the storage layer between the conduction electrode and magnetically frustrated layer is dependent on the direction of electric polarisation of the storage layer.

2. A non-volatile memory cell according to claim 1, wherein the storage layer is a ferroelectric material.

3. A non-volatile memory cell according to claim 1, wherein the storage layer has a thickness of 0.1 nm or more, preferably 0.4 nm or more and more preferably 1 nm or more.

4. A non-volatile memory cell according to claim 1, wherein the storage layer has a thickness 5 nm or less and more preferably 3 nm or less.

5. A non-volatile memory cell according to claim 1, wherein the storage layer is composed from a material selected from a group consisting of $A'_x A''_{(1-x)} B'_y B''_{(1-y)} O_3$ where A'&A" are one or more selected from a group comprising Ca, Sr, Ba, Bi, Pb, La and B'&B" are one or more selected from a group comprising Ti, Zr, Mo, W, Nb, Sn, Sb, In, Ga, Cr, Mn, Al, Co, Fe, Mg, Ni, Zn, Bi, Hf, Ta, or ZnO doped with Li or Be.

6. A non-volatile memory cell according to claim 1, wherein the storage layer is composed from a perovskite structure or a structure that can be grown in crystalline form on a layer with perovskite structure.

7. A non-volatile memory cell according to claim 1, wherein the storage layer is composed from a material with a perovskite-related structure such as $Bi_4Ti_3O_{12}$.

8. A non-volatile memory cell according to claim 1, wherein the conduction electrode is a paramagnetic, ferromagnetic, ferrimagnetic or antiferromagnetic material.

9. A non-volatile memory cell according to claim 1, wherein the conduction electrode has an antiperovskite structure.

10. A non-volatile memory cell according to claim 1, wherein the conduction electrode is composed from a material selected from a group consisting of $Mn_3FeN$, $Mn_3ZnC$, $Mn_3AlC$, $Mn_3GaC$, $Mn_4N$, $Mn_{4-x}Ni_xN$, $Mn_{4-x}Sn_xN$, Pt, Au and Al.

11. A non-volatile memory cell according to claim 1, wherein the magnetically frustrated layer has an antiperovskite structure.

12. A non-volatile memory cell according to claim 1, wherein the magnetically frustrated layer is a piezomagnetic material.

13. A non-volatile memory cell according to claim 1, wherein the magnetically frustrated layer is $Mn_3GaN$ or $Mn_3NiN$, or $Mn_3GaN$ or $Mn_3NiN$ based such as $Mn_{3-x}A_xGa_{1-y}B_yN_{1-z}$ or $Mn_{3-x}A_xNi1-yByN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn.

14. A non-volatile memory cell according to claim 1, wherein the magnetically frustrated layer is $Mn_3SnN$ or $M_3SnN$ based such as $Mn_{3-x}A_xSn_{1-y}BN_{1-z}$, where A and B are one or more elements selected from the list including: Ag, Al, Au, Co, Cu, Fe, Ga, Ge, In, Ir, Ni, Pd, Pt, Rh, Sb, Si, Sn, Zn.

15. A non-volatile memory cell according to claim 1, wherein a lattice mismatch between the storage layer and the magnetically frustrated layer and/or between the storage layer and the conduction electrode is less than ±10%, preferably less than ±1%.

16. A method of reading data from a non-volatile memory cell comprising a storage layer in which data is stored as a direction of electric polarisation, the storage layer being sandwiched between a conduction electrode and a magnetically frustrated layer, wherein the conduction electrode and magnetically frustrated layer have a different change in density of states in response to a change in electric polarisation in the storage layer, the method comprising:
   measuring the tunnelling resistance between the conduction electrode and the magnetically frustrated material, thereby to determine an electric polarisation direction of the storage layer and so read the data stored in the storage layer.

17. The method of claim 16, wherein measuring the tunnelling resistance comprises applying a potential difference between the conduction electrode and the magnetically frustrated layer and measuring the current.

18. The method of claim 17, wherein the potential difference is lower than that required to change the electric polarisation of the storage layer.

19. The method of claim 16, wherein the storage layer has a magnetic order due to the proximity of the conduction electrode and magnetically frustrated layer.

20. The method of claim 16, wherein the non-volatile memory cell is a non-volatile memory cell according to claim 1.

* * * * *